(12) United States Patent
Nakai et al.

(10) Patent No.: US 9,303,332 B2
(45) Date of Patent: Apr. 5, 2016

(54) SILICON SINGLE CRYSTAL SUBSTRATE AND METHOD OF MANUFACTURING THE SAME

(75) Inventors: Katsuhiko Nakai, Yamaguchi (JP); Masamichi Ohkubo, Yamaguchi (JP); Hikaru Sakamoto, Hikari (JP)

(73) Assignee: SILTRONIC AG, Munich (DE)

( * ) Notice: Subject to any disclaimer, the term of this patent is extended or adjusted under 35 U.S.C. 154(b) by 710 days.

(21) Appl. No.: 13/610,946

(22) Filed: Sep. 12, 2012

(65) Prior Publication Data

US 2013/0161793 A1     Jun. 27, 2013

(30) Foreign Application Priority Data

Dec. 21, 2011 (JP) ................. 2011-279956

(51) Int. Cl.
C30B 29/06 (2006.01)
C30B 15/04 (2006.01)
C30B 15/20 (2006.01)
C30B 33/02 (2006.01)

(52) U.S. Cl.
CPC ............... C30B 29/06 (2013.01); C30B 15/04 (2013.01); C30B 15/206 (2013.01); C30B 33/02 (2013.01)

(58) Field of Classification Search
CPC combination set(s) only.
See application file for complete search history.

(56) References Cited

U.S. PATENT DOCUMENTS

| | | | |
|---|---|---|---|
| 5,968,264 A * | 10/1999 | Iida et al. | 117/30 |
| 2004/0192015 A1 | 9/2004 | Ammon et al. | |
| 2007/0155134 A1 | 7/2007 | Nakai et al. | |
| 2007/0175385 A1 * | 8/2007 | Kurita | 117/106 |
| 2007/0193501 A1 | 8/2007 | Ono et al. | |
| 2007/0240628 A1 | 10/2007 | Watanabe et al. | |
| 2008/0187736 A1 * | 8/2008 | Sattler et al. | 428/220 |
| 2009/0026423 A1 * | 1/2009 | Kirscht et al. | 252/512 |
| 2009/0226736 A1 | 9/2009 | Kurita et al. | |
| 2011/0259259 A1 | 10/2011 | Harada et al. | |

FOREIGN PATENT DOCUMENTS

| | | |
|---|---|---|
| CN | 1540042 A | 10/2004 |
| CN | 101016651 A | 8/2007 |
| CN | 101054721 A | 10/2007 |
| JP | 2003137687 A | 5/2003 |
| JP | 2004-111732 A | 4/2004 |

(Continued)

OTHER PUBLICATIONS

W. Zulchner and D. Huber, Crystal Growth, Properties and Applications, p. 28, Springer-Verlag, New York, 1982.

*Primary Examiner* — Duy Deo
*Assistant Examiner* — Erin Bergner
(74) *Attorney, Agent, or Firm* — Brooks Kushman P.C.

(57) ABSTRACT

Silicon single crystal substrates having uniform resistance, few BMDs in a surface layer and a moderate number of BMDs in a center of thickness of the substrate are formed from Czochralski silicon single crystals. The substrates have a resistivity in the center of a first main surface not lower than 50 Ω·cm and a rate of change in resistivity in the first main surface not higher than 3%, an average density of bulk micro defects in a region between the first main surface and a plane at a depth of 50 μm of less than $1 \times 10^8/cm^3$, and an average density of bulk micro defects in a region lying between a plane at a depth of 300 μm and a plane at a depth of 400 μm from the first main surface not lower than $1 \times 10^8/cm^3$ and not higher than $1 \times 10^9/cm^3$.

9 Claims, 7 Drawing Sheets

(56) References Cited

FOREIGN PATENT DOCUMENTS

| | | |
|---|---|---|
| JP | 2005142434 | 6/2005 |
| JP | 2006-523993 A | 10/2006 |
| JP | 2007191350 A | 8/2007 |
| JP | 2007314374 | 12/2007 |
| TW | 200945421 A | 11/2009 |
| WO | 2004093319 A2 | 10/2004 |
| WO | 2009151077 A1 | 12/2009 |
| WO | 2012089392 A1 | 7/2012 |

* cited by examiner

US 9,303,332 B2

SILICON SINGLE CRYSTAL SUBSTRATE AND METHOD OF MANUFACTURING THE SAME

CROSS-REFERENCE TO RELATED APPLICATIONS

This application claims priority to Japanese Patent Application No. JP2011-279956 filed Dec. 21, 2011 which is herein incorporated by reference.

BACKGROUND OF THE INVENTION

1. Field of the Invention

The present invention relates to a silicon single crystal substrate and a method of manufacturing the same, and particularly to silicon single crystal substrates formed by slicing silicon single crystals grown by the Czochralski method and a method of manufacturing the silicon single crystals.

2. Background Art

Power devices mounted on cars, home appliances or the like should have a high breakdown voltage, and the resistance of the substrate affects the characteristics thereof. Therefore, a silicon wafer used as the substrate is required to be high in resistivity, with a low degree of variability.

Silicon single crystals used for substrates for power devices are generally manufactured by the Czochralski method ("CZ" method). With this CZ method, since the segregation coefficient of dopants such as boron and phosphorus with respect to the silicon single crystal is less than 1, dopant concentration in the silicon melt becomes higher as the silicon single crystal grows. Therefore, the dopant concentration in the grown silicon single crystal varies in the direction of the growth axis, and consequently, resistivity of the silicon single crystal also varies in the axial direction. Thus, it has been difficult to control resistivity.

Japanese Patent Laid-Open Application No. 2003-137687 describes a method of suppressing variation in resistivity in the direction of crystal growth by adding phosphorus corresponding to 25 to 30% of the boron concentration to an initial silicon melt, and growing the crystal by the Czochralski method.

Japanese Patent Laid-Open Application No. 2007-191350 describes a method of manufacturing a silicon single crystal wafer for an IGBT (Insulated Gate Bipolar Transistor) in which the variation in resistivity in a radial direction of the wafer is not higher than 5%.

Recently, a power semiconductor formed with a BCD (Bi-polar Transistor, CMOS (Complementary Metal Oxide Semiconductor), and DMOS (Diffused Metal Oxide Semiconductor)) process has widely been used for applications where breakdown voltages are intermediate, i.e., up to 200 V. The BCD process refers to a process technique, in which a bipolar transistor used for analog process control, a fast operating CMOS suitable for a digital control circuit, and a DMOS suitable for controlling a power MOSFET (Metal Oxide Semiconductor Field Effect Transistor) are integrated.

A silicon substrate for a power device manufactured by the BCD process is required to have uniform resistance in the substrate, few oxygen precipitates, or bulk micro defects (BMD), in the surface layer of the substrate, and a moderate amount of BMDs in a center of thickness of the substrate.

With the method described in Japanese Patent Laid-Open Application No. 2003-137687 the rate of change in resistivity in the axial growth direction up to a solidified fraction of 90% is high, and the quality required for BCD devices cannot be achieved. In addition, with the method described in Japanese Patent Laid-Open Application No. 2007-191350 the variation of resistivity in the radial direction is great, and the quality required of the BCD device thus also cannot be achieved. Moreover, a device described in Japanese Patent Laid-Open No. 2007-191350 is an IGBT, wherein current flows in a direction perpendicular to a surface of the substrate. Therefore, BMDs should be less across a direction of thickness of the substrate. Decrease in BMDs, however, leads to a lower capability for gettering heavy metals.

SUMMARY OF THE INVENTION

The present invention was made in view of the problems above, and an object thereof is to provide a silicon single crystal substrate having uniform resistance in the substrate, less BMDs in a surface layer of the substrate, and moderate BMDs in a center of thickness of the substrate, and a method of manufacturing the same. These and other objects are achieved by growing a silicon single crystal by the CZ method, wherein the boron concentration is not more than $4.0 \times 10^{14}$ atoms/cm$^3$, the boron/phosphorus ratio is tightly controlled, the central portion of the crystal is cooled at $\geq 6°$ C./min from 1200° C.-1100° C., and the ratio of edge cooling to central cooling from the melt temperature to 1350° C. is $\geq 1.4$.

DETAILED DESCRIPTION OF THE PREFERRED EMBODIMENT(S)

Figure 1:
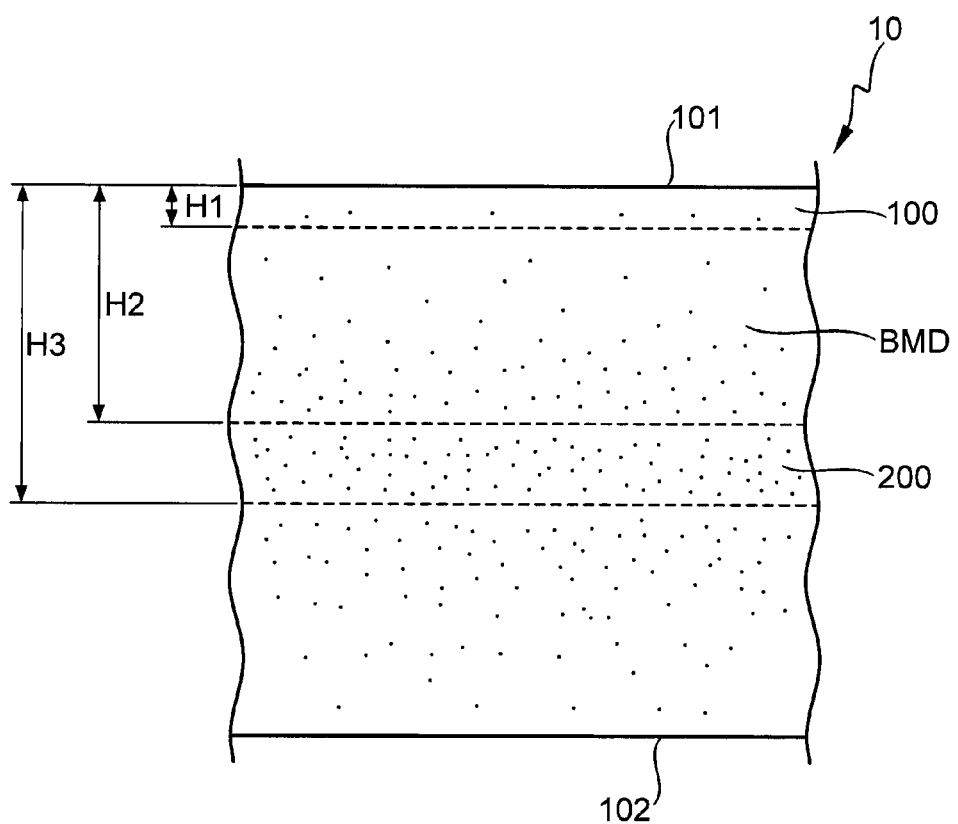
FIG. 1 is a schematic diagram showing a silicon single crystal substrate according to a first embodiment.

A silicon single crystal substrate according to the present invention is a silicon single crystal substrate formed by slicing silicon single crystal grown by the Czochralski method, and it has the following characteristics. The silicon single crystal substrate has a first main surface and a second main surface opposite the first main surface. Resistivity in the center of the first main surface of the silicon single crystal substrate is not lower than 50 Ω·cm and the rate of change in resistivity in the first main surface is not higher than 3%. An average density of oxygen precipitate bulk micro defects in a device formation region which is a region lying between the first main surface and a plane at a depth of 50 µm from the first main surface toward the second main surface is lower than $1 \times 10^8$ /cm$^3$. An average density of oxygen precipitate bulk micro defects in a region lying between a plane at a depth of 300 µm and a plane at a depth of 400 µm from the first main surface toward the second main surface is not lower than $1 \times 10^8$ /cm$^3$ and not higher than $1 \times 10^9$ /cm$^3$.

Preferably, the silicon single crystal substrate has an oxygen concentration not lower than $5.0 \times 10^{17}$ atoms/cm$^3$ and not higher than $7.0 \times 10^{17}$ atoms/cm$^3$ and a nitrogen concentration not lower than $2.0 \times 10^{13}$ atoms/cm$^3$ and not higher than $4.0 \times 10^{14}$ atoms/cm$^3$.

A BCD device according to the present invention is formed on the silicon single crystal substrate above, and a CMOS, a DMOS, and a bipolar transistor are formed in the device formation region.

A method of manufacturing a silicon single crystal substrate according to the present invention has the following steps. An initial silicon melt having a boron concentration not higher than $4 \times 10^{14}$ atoms/cm$^3$ and a ratio of phosphorus to boron not lower than 0.42 and not higher than 0.50, is prepared. A silicon single crystal is grown by the Czochralski method from the initial silicon melt. The silicon single crystal is sliced to form a silicon single crystal substrate. In the step of growing the silicon single crystal, the crystal is grown under conditions such that the ratio of the rate of cooling an edge portion to a rate of cooling a central portion of the silicon single crystal from the melting point of silicon to 1350° C. is not lower than 1.4 and not higher than 2.0, and the rate of cooling the central portion from 1200° C. to 1100° C. is not less than 6° C./minute. The silicon single crystal has an oxygen concentration which is not lower than $5.0 \times 10^{17}$ atoms/cm$^3$ and not higher than $7.0 \times 10^{17}$ atoms/cm$^3$ and has a nitrogen concentration which is not lower than $2.0 \times 10^{13}$ atoms/cm$^3$ and not higher than $4.0 \times 10^{14}$ atoms/cm$^3$.

Preferably, the inventive method further includes the step of annealing the silicon single crystal substrate sliced from the silicon single crystal. In the annealing step, a heat treatment at a temperature not lower than 1200° C. and not higher than 1250° C. is carried out for a period not less than 1 hour and not longer than 8 hours in a noble gas atmosphere in which the impurity concentration is not higher than 0.5% in volume ratio, or in a non-oxidizing atmosphere.

According to the present invention, a silicon single crystal substrate having uniform resistance in the substrate, less BMDs in a surface layer of the substrate, and moderate BMDs in a center of thickness of the substrate can be obtained.

An embodiment of the present invention will be described hereinafter with reference to the drawings. It is noted that the same or corresponding elements in the drawings below have the same reference numerals allotted and description thereof will not be repeated. A construction of a silicon single crystal substrate according to the present embodiment will initially be described with reference to FIG. 1.

A silicon single crystal substrate 10 according to the present embodiment is formed by slicing silicon single crystal 1 (see FIG. 2) grown by a Czochralski method. Referring to FIG. 1, silicon single crystal substrate 10 has a first main surface 101 and a second main surface 102 opposite to first main surface 101. A surface layer portion of silicon single crystal substrate 10 (a region lying between first main surface 101 and a plane at a depth H1 of 50 µm from first main surface 101 toward second main surface 102) serves as a device formation region 100. In device formation region 100, devices such as bipolar transistors, CMOS, DMOS, or the like are formed. Device formation region 100 is desirably lower in BMD density than other regions of silicon single crystal substrate 10, from a point of view of lowering the leakage current at a pn junction. Average density of BMDs in the device formation region 100 is lower than $1 \times 10^8$ /cm$^3$. On the other hand, a moderate amount of BMDs are preferably present in a central region 200 in a direction of thickness of the silicon single crystal substrate 10 (a region lying between a plane at a depth H2 of 300 µm and a plane at a depth H3 of 400 µm from first main surface 101 toward second main surface 102). A moderate amount of BMD refers to average density of BMDs not lower than approximately $1 \times 10^8$ /cm$^3$ and not higher than approximately $1 \times 10^9$ /cm$^3$.

Resistivity in the center of first main surface 101 of the silicon single crystal substrate 10 is not lower than 50 Ω·cm and the rate of change in resistivity in the first main surface 101 is not higher than 3%. Preferably, silicon single crystal substrate 10 has an oxygen concentration which is not lower than $5.0 \times 10^{17}$ atoms/cm$^3$ and not higher than $7.0 \times 10^{17}$ atoms/cm$^3$ and has a nitrogen concentration which is not lower than $2.0 \times 10^{13}$ atoms/cm$^3$ and not higher than $4.0 \times 10^{14}$ atoms/cm$^3$.

If the average density of BMDs in the central region 200 in the direction of thickness is lower than $1 \times 10^8$ /cm$^3$, capability of gettering heavy metals will be essentially the same as in FZ (Floating Zone) crystals where no BMDs are created, which is considered as having no gettering capability. On the other hand, if the average density of BMDs in the central region 200 in the direction of thickness exceeds $1 \times 10^9$ /cm$^3$, the average density of BMDs in device formation region 100 will exceed $1 \times 10^8$ /cm$^3$. Preferably, the average density of BMDs in central region 200 in the direction of thickness is not lower than $5 \times 10^8$ /cm$^3$ and not higher than $1 \times 10^9$ /cm$^3$.

When the average density of BMDs in device formation region 100 exceeds $1 \times 10^8$ /cm$^3$, leakage current at pn junctions is higher than in FZ wafers where no BMDs are present and hence characteristics of a power semiconductor become poor. Preferably, the average density of BMDs in device formation region 100 is not higher than $5 \times 10^7$ /cm$^3$. More preferably, the average density of BMDs in device formation region 100 is not higher than $1 \times 10^7$ /cm$^3$. It is noted that an average density of BMDs in device formation region 100 which is in a range of not lower than $5 \times 10^6$ /cm$^3$ and not higher than $1 \times 10^8$ /cm$^3$ does not give rise to a practical problem of a leakage current at the pn junction. The lower limit of an average density of BMDs in device formation region 100 may be $5 \times 10^6$ /cm$^3$.

A manufacturing apparatus for manufacturing a silicon single crystal according to the present embodiment will now be described with reference to FIG. 2.

Figure 2:
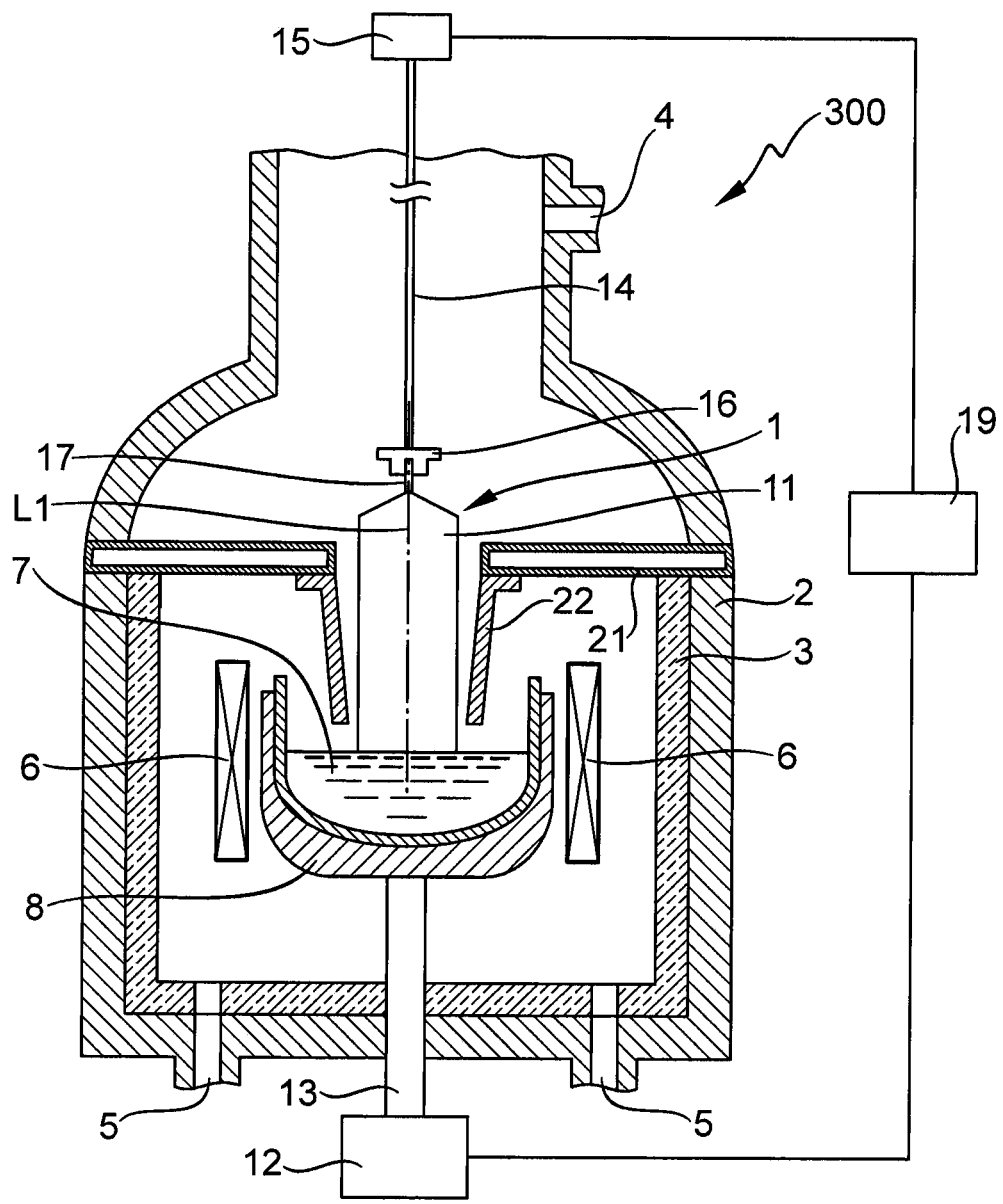
FIG. 2 is a schematic diagram showing a manufacturing apparatus for manufacturing a silicon single crystal substrate according to the first embodiment.

Referring to FIG. 2, a silicon single crystal manufacturing apparatus 300 mainly has a chamber 2, a heater 6, a crucible 8, a crucible support shaft 13, a pull-up wire 14, a cooling structure 21, and a cooling element 22. A heat insulator 3 is provided on an inner wall of chamber 2. A gas supply port 4 for introducing an inert gas such as argon (Ar) is provided in an upper portion of chamber 2, and an exhaust port 5 for exhausting a gas in chamber 2 is provided in a bottom portion of chamber 2. Crucible 8 is filled with a silicon melt 7 serving as a source material. Heater 6 is provided around crucible 8, and silicon melt 7 can be prepared by melting a silicon source material. Crucible support shaft 13 extends from a lower end portion of crucible 8 to the bottom portion of the chamber and it is rotatably supported by a crucible support shaft drive device 12. Pull-up wire 14 serves to pull up silicon single crystal 1 and it is vertically movable by a pull-up wire drive device 15.

Cooling structure 21 and cooling element 22 are arranged to surround grown silicon single crystal 1, and they serve to cool silicon single crystal 1. Cooling structure 21 is a structure allowing a liquid coolant to flow therein. Cooling structure 21 is, for example, a water-cooling chamber using water as a coolant and made of stainless steel. Cooling element 22 is made of a material having high thermal conductivity and arranged to cool silicon single crystal 1. A substance high in thermal conductivity and thermal radiation factor can be employed as a material for forming cooling element 22, for example, silver or a silver alloy.

A method of manufacturing silicon single crystal substrate 10 in the present embodiment will be described with reference to FIG. 3.

Figure 3:
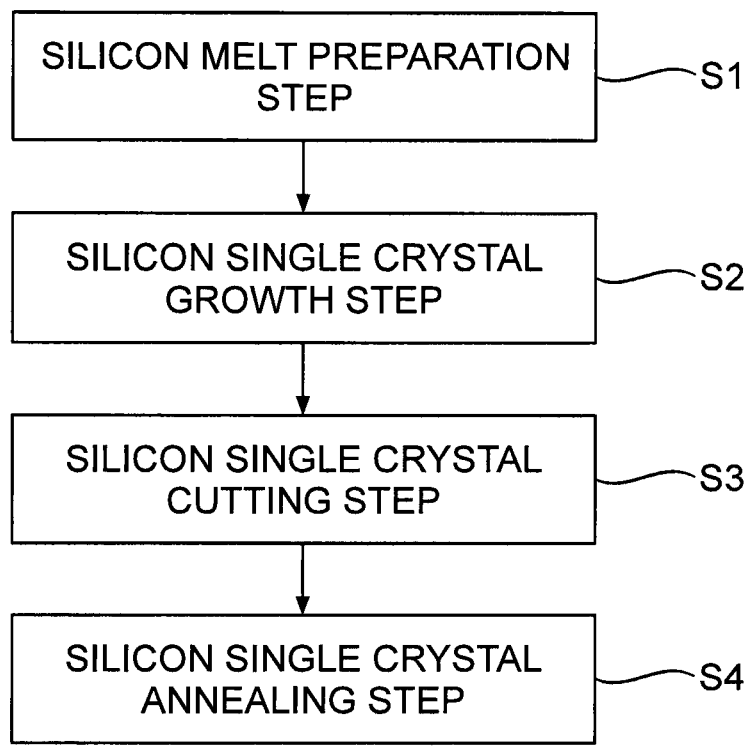
FIG. 3 is a flowchart schematically showing a method of manufacturing a silicon single crystal substrate according to the first embodiment.

As shown in FIG. 3, the method of manufacturing a silicon single crystal substrate according to the present embodiment serves to manufacture silicon single crystals by the Czochralski method, and mainly has a silicon melt preparation step S1, a silicon single crystal growth step S2, a silicon single crystal cutting step S3, and a silicon single crystal annealing step S4.

Initially, silicon melt preparation step S1 is performed. In silicon melt preparation step S1, crucible 8 is filled with a silicon source material and heated by heater 6, so that the silicon source material is melted to prepare silicon melt 7. Boron and phosphorus are added to silicon melt 7. The boron concentration is not higher than $4 \times 10^{14}$ atoms/cm$^3$ and the ratio of phosphorus concentration to the boron concentration is not lower than 0.42 and not higher than 0.50.

In order to manufacture p-type silicon single crystal 1, boron (B) is added as a p-type impurity (acceptor) to the silicon melt from which single crystal initially grows (hereinafter referred to as an "initial silicon melt"). In addition, phosphorus (P), which is an n-type impurity (donor) and lower than boron in segregation coefficient with respect to silicon single crystal 1, is further added. The reason why phosphorus which is an impurity opposite to boron in conductivity type and lower than boron in segregation coefficient with respect to silicon single crystal 1 is thus added to the initial silicon melt will be described later.

Nitrogen is added by introducing a wafer with a nitride film into the silicon melt. The concentration of nitrogen in a silicon wafer obtained by slicing the grown crystal is measured with a secondary ion mass spectrometer (SIMS). It is noted that a wafer having a nitrogen concentration not higher than $5 \times 10^{14}$ atoms/cm$^3$ cannot be subjected to measurement with SIMS and hence nitrogen concentration calculated in accordance with an equation below is employed. Such an equation will be described in detail below.

The method of adding nitrogen in the manufacturing method according to the present invention is not particularly restricted and any known method can be employed, for example, introducing a nitrogen gas while a silicon source material is being melted, introducing a silicon substrate having a nitride deposited thereon with CVD or the like while a source material is being melted, and the like. In addition, in the case of nitrogen, a segregation coefficient k representing a ratio with respect to concentration of an impurity in a melt that is taken into the crystal as the silicon melt is solidified, is $7 \times 10^{-4}$ (W. Zulehner and D. Huber, Crystal Growth, Properties and Applications, p 28, Springer-Verlag, New York, 1982).

The concentration of nitrogen taken into the crystal from a silicon melt used in the manufacturing method according to the present invention can be calculated in accordance with an equation (Equation 1) below.

Concentration of Nitrogen in Wafer=$k \times$(1-Solidified Fraction)$^{(k-1)} \times$Concentration of Nitrogen in Melt  Equation 1:

It is noted that the concentration of nitrogen in the melt can also be referred to as an initial melt nitrogen concentration. Here, a solidified fraction (g) of silicon crystal is found in accordance with an equation (Equation 2) below.

Solidified Fraction(g)of Silicon Crystal=(Mass of Crystallized Silicon)/(Initial Melt Mass)  Equation 2:

Silicon single crystal growth step S2 is practiced next. In silicon single crystal growth step S2, silicon single crystal 1 is grown by the Czochralski method from initial silicon melt 7. A seed crystal 17 attached to a seed chuck 16 is brought down to a surface of silicon melt 7 and immersed therein. Thereafter, pull-up wire 14 is wound up by pull-up wire drive device 15 to thereby pull up silicon single crystal 1. After silicon single crystal 1 undergoes growth of a conical portion (an expanded portion) and grows to a target diameter, a straight part 11 of silicon single crystal 1 is grown to a prescribed length. In the step of growing silicon single crystal 1, silicon single crystal 1 is grown at a ratio of a rate of cooling an edge portion to a rate of cooling a central portion of silicon single crystal 1 from a melting point of silicon to 1350° C., of not lower than 1.4 and not higher than 2.0. In addition, silicon single crystal 1 is grown under conditions such that the rate of cooling the central portion from 1200° C. to 1100° C. is not less than 6° C./minute. Silicon single crystal 1 has an oxygen concentration not lower than $5.0 \times 10^{17}$ atoms/cm$^3$ and not higher than $7.0 \times 10^{17}$ atoms/cm$^3$ and has a nitrogen concentration not lower than $2.0 \times 10^{13}$ atoms/cm$^3$ and not higher than $4.0 \times 10^{14}$ atoms/cm$^3$.

The rate of growth of the silicon single crystal 1 in silicon single crystal growth step S2 can be not less than 0.9 mm/minute and the rate of cooling a crystal edge portion can be at least 1.4 times as high as a rate of cooling a crystal central portion. Here, the rate of cooling refers to an average in a range from the melting point to 1350° C. during crystal growth, which is a value calculated by multiplying an average temperature gradient (° C./mm) in a direction of axis of crystal growth from the melting point to 1350° C. by a rate of growth (mm/minute). A rate of growth less than 0.9 mm/minute is not preferred because productivity is poor. A rate of cooling the crystal edge portion less than 1.4 times as high as the rate of cooling the crystal central portion leads to poorer efficiency in cooling silicon single crystal 1, which results in a rate of growth less than 0.9 mm/minute and poorer productivity. The upper limit of the rate of growth is 1.9 mm/minute in consideration of the capabilities of an apparatus for growing silicon single crystal 1 which can be realized, and the upper limit of the rate of cooling the crystal edge portion is twice as high as the rate of cooling the crystal central portion.

Silicon single crystal 1 is cooled by cooling structure 21 (FIG. 2) and cooling element 22 (FIG. 2) arranged to surround growing silicon single crystal 1. Radiant heat from silicon single crystal 1 is incident on cooling element 22 made of a material having high thermal conductivity. Cooling element 22 is connected to cooling structure 21 so as to be kept at a low temperature. Therefore, the efficiency of exchange of radiant heat with the silicon single crystal 1 is good and the rate of cooling of the silicon single crystal 1 can be improved.

If the rate of cooling the central portion from 1200° C. to 1100° C. is less than 6° C./minute, the average density of BMDs in the device formation region 100 will exceed $1 \times 10^8$ /cm$^3$. As the diameter increases, the silicon single crystal 1 is less likely to be cooled effectively. Therefore, in the case of a crystal having a diameter not less than 200 mm, 8° C./minute is considered as the upper limit that can be realized.

If the oxygen concentration in silicon single crystal 1 is lower than $5.0\times10^{17}$ atoms/cm$^3$, the average density of BMDs in thickness center region 200 will be lower than $1\times10^8$ /cm$^3$. On the other hand, if the oxygen concentration in silicon single crystal 1 exceeds $7.0\times10^{17}$ atoms/cm$^3$, the average density of BMDs in device formation region 100 will exceed $1\times10^8$ /cm$^3$. Preferably, the oxygen concentration in silicon single crystal 1 is not lower than $5.0\times10^{17}$ atoms/cm$^3$ and not higher than $6.0\times10^{17}$ atoms/cm$^3$. It is noted that a value calculated by using a scaling factor ($3.03\times10^{17}$ /cm$^2$) defined by Japan Electronics and Information Technology Industries Association (JEITA) is used as the oxygen concentration. Specifically, Standard Test Method for Interstitial Atomic Oxygen Content in silicon crystal through infrared absorption (ex-JEIDA-61) is employed.

Oxygen is introduced into the melt as the silicon single crystal 1 grows and as a crucible made of quartz dissolves. Oxygen concentration in the crystal can be adjusted by controlling conditions for growth such as the rotation speed of the quartz crucible and the flow of gas in the crystal pulling furnace.

If the nitrogen concentration in the silicon single crystal 1 is lower than $2.0\times10^{13}$ atoms/cm$^3$ or exceeds $4.0\times10^{14}$ atoms/cm$^3$, the average density of BMDs in device formation region 100 will exceed $1\times10^8$ /cm$^3$. Preferably, the nitrogen concentration in the silicon single crystal 1 is not lower than $1.0\times10^{14}$ atoms/cm$^3$ and not higher than $4.0\times10^{14}$ atoms/cm$^3$.

Next, silicon single crystal cutting step S3 is performed. In silicon single crystal cutting step S3, initially, straight part 11 is grown to the prescribed length, and thereafter wind-up of pull-up wire 14 is stopped. Thereafter, by lowering crucible 8, silicon single crystal 1 is separated from silicon melt 7. Thereafter, silicon single crystal 1 is sliced along a plane perpendicular to the direction of axis of growth of silicon single crystal 1. Silicon single crystal substrates 10 are thus obtained.

Next, a silicon single crystal annealing step S4 may be performed. In the silicon single crystal annealing step, silicon single crystal substrate 10 fabricated by slicing silicon single crystal 1 is annealed. In the annealing step, heat treatment at a temperature not lower than 1200° C. and not higher than 1250° C. is carried out for a period not shorter than 1 hour and not longer than 8 hours in a noble gas atmosphere in which the impurity concentration is not higher than 0.5% in volume ratio, or in a non-oxidizing atmosphere. An oxide film formed during heat treatment at a temperature not lower than 1200° C. and not higher than 1250° C. for a period not shorter than 1 hour and not longer than 8 hours in a non-oxidizing atmosphere is suppressed to 2 nm or thinner.

According to the manufacturing method in the present embodiment, p-type silicon single crystals 1 in which resistivity along a central axis of growth L1 is not lower than 50 Ω·cm, the rate of change in resistivity along central axis of growth L1 is not higher than 10%, and the rate of change in resistivity in a cross-section perpendicular to central axis of growth L1 is not higher than 3%, can be manufactured. The reason therefor will be described below. It is noted that the rate of change in resistivity refers to a value defined in the following equation.

Figure 4:
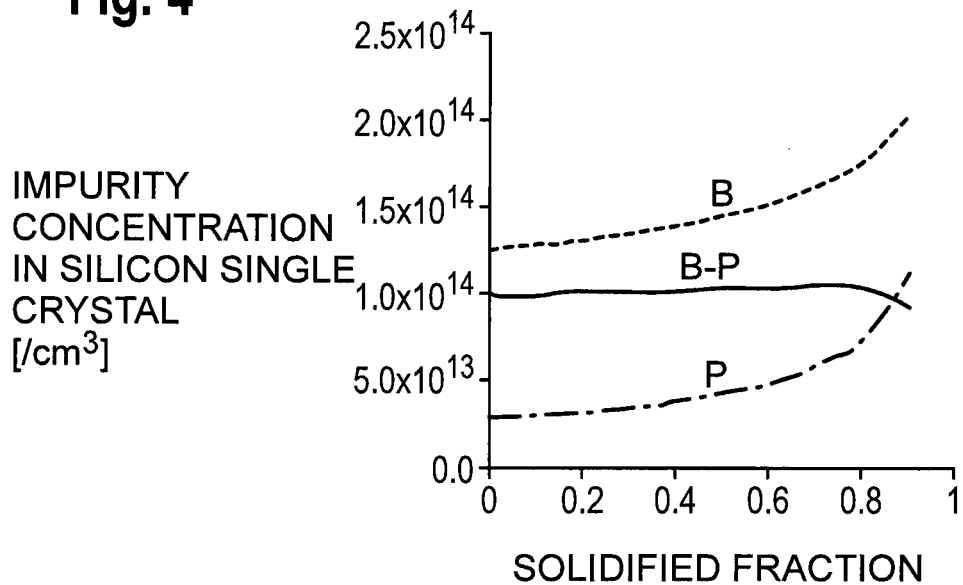
FIG. 4 shows a result of simulation showing the relationship between a solidified fraction of a silicon single crystal and the impurity concentration in silicon single crystal.
Figure 5:
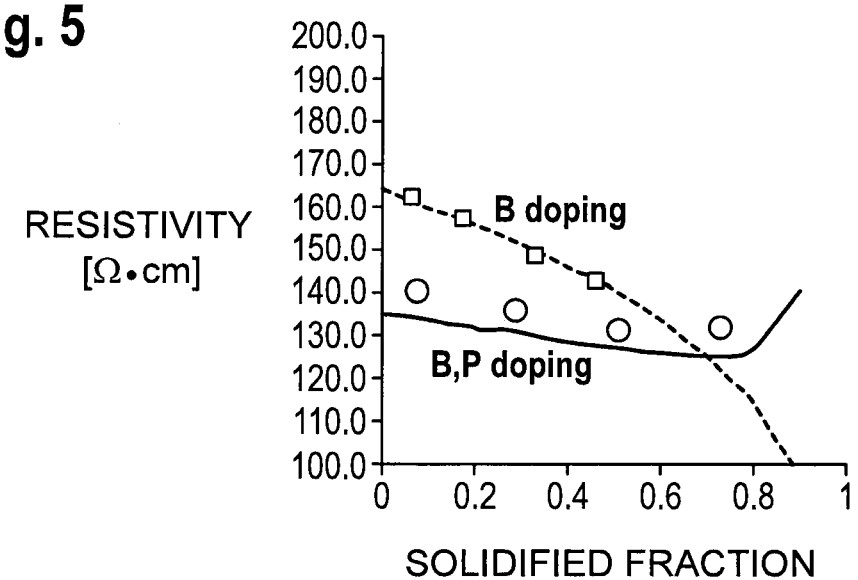
FIG. 5 shows a result of measurement and a result of simulation showing the relation between a solidified fraction and the resistivity of a silicon single crystal.

Rate of Change in Resistivity=(Maximum Value of Resistivity−Minimum Value of Resistivity)/ (Maximum Value of Resistivity)  Equation 3:

FIG. 4 is a diagram showing a result of simulation of the relationship between a solidified fraction of silicon single crystal 1 and the impurity concentration in silicon single crystal 1. The abscissa in FIG. 4 represents a solidified fraction of silicon single crystal 1. The ordinate in FIG. 4 represents impurity concentration in silicon single crystal 1. FIG. 5 is a diagram showing a result of measurement and a result of simulation of the relationship between a solidified fraction and the resistivity of silicon single crystal 1. The abscissa in FIG. 5 represents a solidified fraction of silicon single crystal 1. The ordinate in FIG. 5 represents the resistivity of silicon single crystal 1. A dot plot in FIG. 5 represents a result of actual measurement, and a line plot represents a result of simulation. Data shown with a black square in FIG. 5 shows a case where boron alone is added to a silicon melt. Data shown with a black circle in FIG. 5 shows a case where boron and phosphorus are added to a silicon melt.

As shown in FIG. 4, in the case where boron alone was added to the initial silicon melt, as silicon single crystal 1 grows (that is, a solidified fraction becomes higher), the impurity concentration in silicon single crystal 1 exponentially increases. Consequently, as shown in FIG. 5, as silicon single crystal 1 grows, the resistivity of silicon single crystal 1 decreases. This is because the segregation coefficient k of boron with respect to silicon single crystal 1 is around 0.78, which is less than 1, and therefore, as silicon single crystal 1 grows, concentration of boron in the silicon melt proceeds and a ratio of boron taken into silicon single crystal 1 becomes higher.

In the case where phosphorus alone was added to the initial silicon melt as well, similarly, as silicon single crystal 1 grows, the impurity concentration in silicon single crystal 1 exponentially increases. On the other hand, the segregation coefficient k of phosphorus with respect to silicon single crystal 1 is around 0.38, which is lower than the segregation coefficient of boron. Therefore, a rate (speed) of concentration of phosphorus in the silicon melt with growth of silicon single crystal 1 is higher than in the case of boron. Thus, the rate of decreasing the resistivity during growth of silicon single crystal 1 is also higher than in the case where boron is added.

Since boron is a p-type impurity, addition of boron to silicon single crystal 1 produces holes as p-type carriers in silicon single crystal 1. Since phosphorus is an n-type impurity, addition of phosphorus to silicon single crystal 1 produces electrons as n-type carriers in silicon single crystal 1.

In silicon single crystal 1 to which boron and phosphorus were added, the produced carriers opposite to each other in conductivity type cancel each other. Therefore, by adding phosphorus together with boron to silicon single crystal 1 in manufacturing a p-type semiconductor, p-type carrier density in silicon single crystal 1 can be lowered and resistivity can be increased.

In addition, the rate of increase in impurity concentration with growth of silicon single crystal 1 is greater in the case of addition of phosphorus than in the case of addition of boron. Therefore, by canceling the increase in p-type carrier density by an increase in boron concentration during growth of silicon single crystal 1 by increasing n-type carrier density by increasing phosphorus concentration, a decrease in resistivity with growth of the silicon single crystal 1 can be prevented. Namely, by setting a ratio of phosphorus concentration to boron concentration in the initial silicon melt (hereinafter referred to as a "P/B ratio") to an appropriate value, decrease of resistivity with growth of the silicon single crystal 1 can be prevented. Since the concentration of boron and phosphorus added to the initial silicon melt is sufficiently low, boron and phosphorus are considered to be independently segregated with respect to silicon single crystal 1.

Specifically, as shown in FIG. 4, by selecting a P/B ratio of the initial silicon melt such that difference between boron concentration and phosphorus concentration in silicon single crystal 1 in a process of growth of silicon single crystal 1 is constant, a value of resistivity with growth of silicon single crystal 1 can be maintained constant as shown in FIG. 5. As a condition for obtaining data in FIG. 5, concentration of boron to be added to the initial silicon melt was set to $1.6 \times 10^{14}$ atoms/cm$^3$ and a P/B ratio was set to 0.45.

Figure 6:
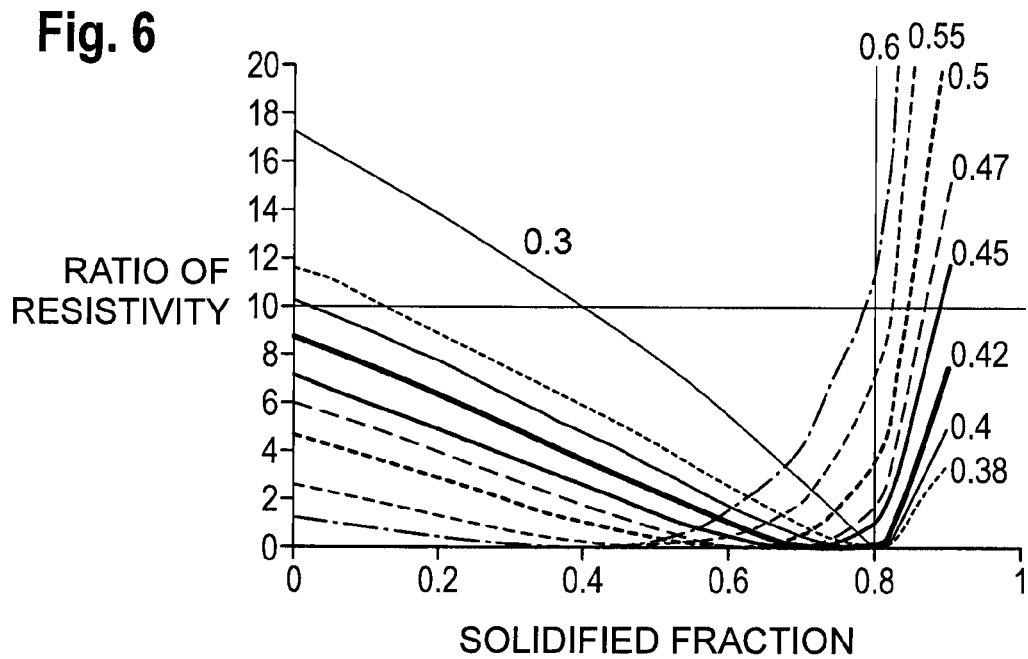
FIG. 6 is a diagram showing a result of simulation of dependency on an initial silicon melt PB ratio of relation between a solidified fraction and the resistivity of silicon single crystal.

FIG. 6 is a diagram showing a result of simulation of dependency on an initial silicon melt P/B ratio of relation between a solidified fraction and resistivity of the silicon single crystal 1. The abscissa in FIG. 6 represents a solidified fraction of silicon single crystal 1. The ordinate in FIG. 6 represents a ratio of resistivity of silicon single crystal 1. Nine sets of data shown in FIG. 6 are data obtained when the P/B ratio was set to 0.3, 0.38, 0.4, 0.42, 0.45, 0.47, 0.5, 0.55, and 0.6, in the order of higher ratio of resistivity when the solidified fraction is set to 0. Here, the ratio of resistivity is defined in the equation below.

Ratio of Resistivity=(Resistivity at Certain Solidified Fraction−Minimum Value of Resistivity of Crystal of Interest)/(Maximum Value of Resistivity of Crystal of Interest)    Equation 4:

According to the simulation result shown in FIG. 6, it can be seen that, by setting the P/B ratio of the initial silicon melt to 0.42 to 0.55 with the solidified fraction being restricted in a range from 0 to 0.80, the rate of change in resistivity along the central axis of growth can be decreased to 10% or lower. As will be described later, however, in order to lower the rate of change in resistivity in a cross-section perpendicular to the central axis of growth, the P/B ratio should be set to 0.42 to 0.50. It is noted that the reason why the solidified fraction is restricted to 0 to 0.80 will also be described later.

When the initial silicon melt has a P/B ratio from 0.42 to 0.50, resistivity of silicon single crystal 1 starts to increase around the solidified fraction of 0.7 as the silicon single crystal 1 grows (hereinafter, a point where the resistivity starts to increase is referred to as a "flexion point"). This phenomenon indicates that p-type carriers (holes) in the silicon single crystal 1 start to decrease, which is caused by the fact that the rate of incorporation of phosphorus into the silicon single crystal 1 exceeds the rate of incorporation of boron.

In the present embodiment, the rate of change in resistivity along the central axis of growth is lowered by going so far as to produce a flexion point. Silicon single crystal 1 after the flexion point is reached also maintains a p conductivity type so long as the phosphorus concentration does not exceed the boron concentration, and no problem arises in using such silicon single crystal for wafers for power devices. By thus further lowering the rate of change in resistivity along the central axis of growth, the rate of change in resistivity in the cross-section perpendicular to the central axis of growth can further be lowered. The reason therefor will be described below.

Figure 7:
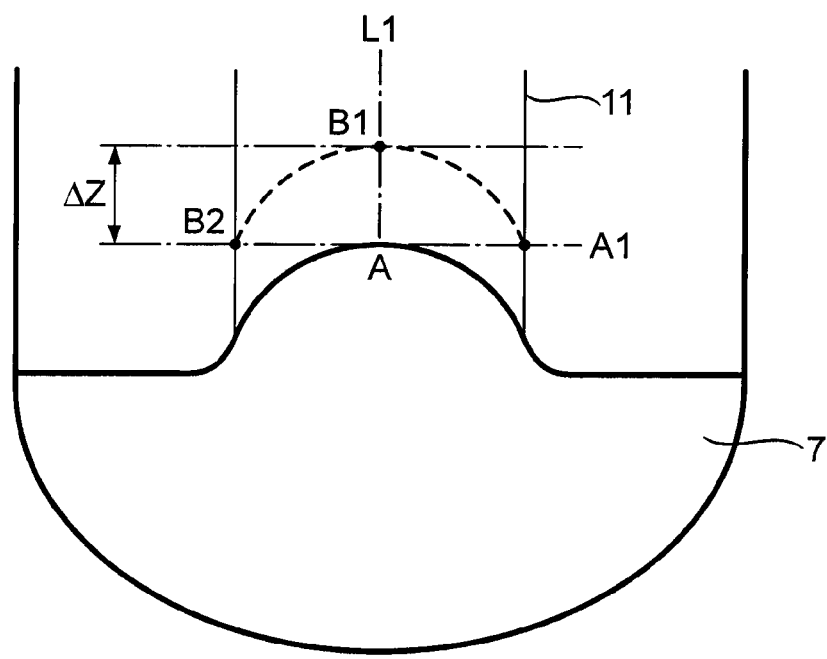
FIG. 7 is a diagram showing a state of a silicon solid-liquid interface at the time of growing silicon single crystal by the Czochralski method.

FIG. 7 is an illustrative diagram showing a silicon solid-liquid interface (a boundary surface between the silicon melt and silicon single crystal 1) during growth of the silicon single crystal 1 by the CZ method. As shown in FIG. 7, the silicon solid-liquid interface during growth of silicon single crystal 1 has a shape protruding in a direction along the central axis of growth L1. A point A indicates an intersection between a current solid-liquid interface and the central axis of growth L1. A point B2 indicates an intersection between a horizontal cross-section (cross-section perpendicular to the central axis of growth) A1 of silicon single crystal 1 including point A and a side surface of silicon single crystal 1. The point B1 indicates an intersection between a past solid-liquid interface and central axis of growth L1. A distance between point A and point B1 is denoted as ΔZ and a difference in resistivity between point A and point B1 is denoted as ΔR (see FIG. 8).

Figure 8:
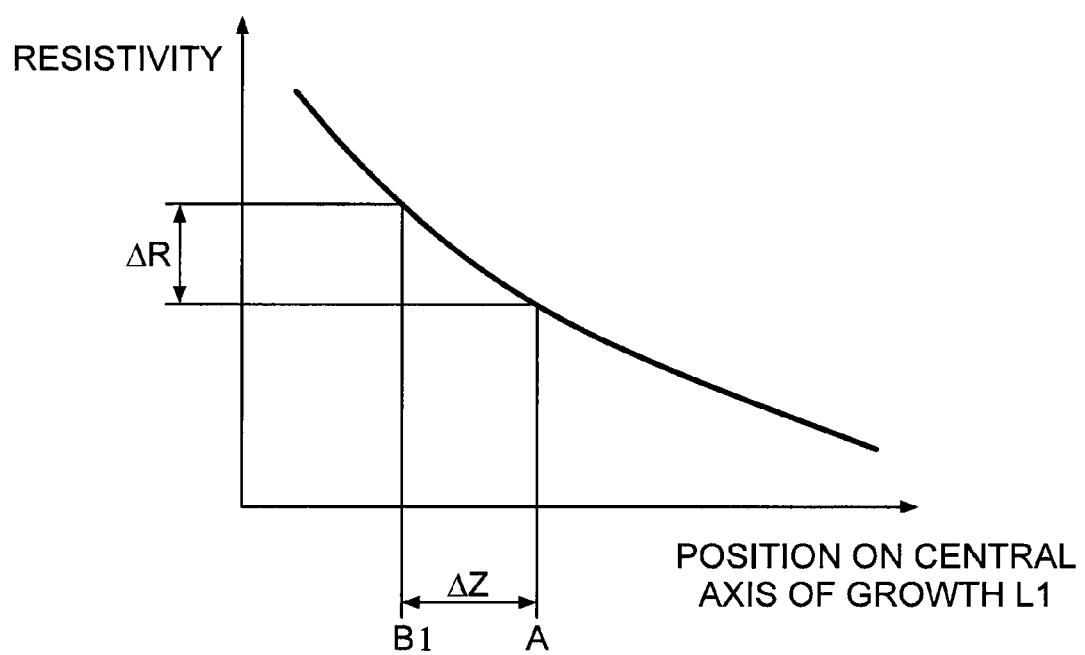
FIG. 8 is a diagram showing the relationship between the resistivity of a silicon single crystal and a position on the growth axis.

FIG. 8 is a diagram showing the relationship between the resistivity of silicon single crystal 1 and a position on the central axis of growth. The abscissa in FIG. 8 represents a position on the central axis of growth of silicon single crystal 1. The ordinate in FIG. 8 shows the resistivity of silicon single crystal 1. Here, since resistivity on the solid-liquid interface is constant, resistivity is the same at point B1 and point B2 in FIG. 7. On the other hand, the change in resistivity between point A and point B1 corresponds to a rate of change in resistivity along the central axis of growth L1, while change in resistivity between point A and point B2 corresponds to a rate of change in resistivity in the cross-section A1 perpendicular to the central axis of growth L1. Therefore, in order to decrease the rate of change in resistivity in cross-section A1 perpendicular to central axis of growth L1, inclination of resistivity ΔR/ΔZ in the direction of central axis of growth L1 should be made gentler. Based on simulation in FIG. 6, in order to make inclination of resistivity gentler, it is effective to set the upper limit of the solidified fraction and to set the P/B ratio within a certain range. Since inclination of resistivity is great at any P/B ratio in a region where the solidified fraction exceeds 0.80, the rate of change in resistivity in a cross-section perpendicular to central axis of growth L1 exceeds 3%. In a case where the solidified fraction is restricted in a range from 0 to 0.80, by setting the P/B ratio in the initial silicon melt in a range not lower than 0.42 and not higher than 0.50, the rate of change in resistivity in a cross-section perpendicular to central axis of growth L1 is not higher than 3% as demonstrated in the Examples which will be described later. More preferably, in a case where the solidified fraction is restricted in a range from 0 to 0.80, by setting the P/B ratio not lower than 0.42 and not higher than 0.47, the rate of change in resistivity in a cross-section perpendicular to the central axis of growth is not higher than 2% as demonstrated in the Examples. When the P/B ratio is higher than 0.50 and not higher than 0.55 in a case where the solidified fraction is restricted in a range from 0 to 0.80, inclination of the resistivity on a crystal bottom side becomes great and hence the rate of change in resistivity in a cross-section perpendicular to the central axis of growth L1 exceeds 3%. By restricting the solidified fraction to less than 0.80, the rate of change in resistivity in a cross-section perpendicular to the central axis of growth L1 cannot be higher than 3% even in the case where the P/B ratio is higher than 0.50 and not higher than 0.55. Restriction of the solidified fraction to less than 0.80, however, is not preferred because productivity becomes poorer.

In order to lower the rate of change in resistivity in a cross-section perpendicular to the central axis of growth, it is also effective to control a condition for cooling silicon single crystal 1 during crystal growth so as to flatten the solid-liquid interface shape, that is, to decrease ΔZ in FIG. 7. In this case, however, the rate of cooling the crystal edge portion should be less than 1.4 times, preferably about equal to the rate of cooling of the crystal central portion. As described previously, as the rate of cooling of the edge portion is lowered, the cooling efficiency becomes poor and the rate of growth is less than 0.9 mm/minute, which results in poorer productivity. The present invention can lessen variation in resistivity without lowering productivity in growing silicon single crystal 1.

By controlling the rate of cooling the crystal edge portion and the rate of cooling the crystal central portion to thereby attain a value of ΔZ in a range from 5 to 15 mm, the rate of change in resistivity in a cross-section perpendicular to the central axis of growth L1 is not higher than 3%, with productivity being maintained. By setting a ratio of the rate of cooling the crystal edge portion to the rate of cooling the crystal central portion to 1.4 or higher and 2.0 or lower, a value of ΔZ can be controlled in a range from 5 to 15 mm.

According to the present embodiment, the rate of change in resistivity in a cross-section perpendicular to the central axis of growth can be lowered without using such special facilities as MCZ (Magnetic field applied Czochralski) in which a crystal is grown while a magnetic field is applied. Therefore, manufacturing cost can be lowered.

Actual measurement of a rate of change in resistivity in cross-section A1 perpendicular to central axis of growth L1 of silicon single crystal 1 was performed in the Examples which will be described below.

It is noted that a wafer cut from silicon single crystal 1 obtained in the present embodiment may be used directly as a wafer for a power device, or a wafer that has been subjected to high-temperature heat treatment which will be described later may be used.

High-temperature heat treatment is desirably performed in a non-oxidizing atmosphere, because voids or other grown-in defects are not sufficiently eliminated during annealing in an oxidizing atmosphere. The non-oxidizing atmosphere refers to an atmosphere not containing an oxidizing gas such as oxygen, and it includes an inert atmosphere and a reducing atmosphere. The inert atmosphere refers to an atmosphere filled, for example, with an inert gas such as argon, helium, neon, nitrogen, or the like. A reducing atmosphere refers to an atmosphere where a reducing gas such as hydrogen, carbon monoxide, ammonia, or the like is present.

A suitable temperature for heat treatment of a wafer is in a range from 1150 to 1250° C., preferably from 1175 to 1215° C., and more preferably from 1185 to 1200° C. If the temperature for heat treatment of a wafer is lower than 1150° C., voids or other grown-in defects are not sufficiently eliminated during annealing. Alternatively, if the temperature exceeds 1250° C., a member of a furnace significantly deteriorates.

A suitable time period for heat treatment of a wafer is not less than 10 minutes and not longer than 2 hours, preferably not less than 30 minutes and not longer than 1.5 hours, and most preferably not less than 50 minutes and not longer than 1 hour. If the time period for heat treatment of a wafer is less than 10 minutes, voids or other grown-in defects are not sufficiently eliminated during annealing. Alternatively, if the time period exceeds 2 hours, productivity becomes poor, which is not preferred.

A commercially available heat treatment furnace (or a reaction chamber) for performing heat treatment (annealing) in the manufacturing method according to the present embodiment may be employed, and the furnace is not particularly restricted. It is noted that it is necessary to avoid growth of an oxide film to 2 nm or greater during heat treatment, because attachment of an oxide film to the surface prevents shrinkage and elimination of defects during annealing. Specifically, such measures as decreasing as much as possible the amount of impurities introduced in the gas atmosphere during heat treatment or decreasing as much as possible the intake of air from the surroundings while inserting a silicon wafer into a furnace are necessary. For example, a noble gas such as argon, in which impurities are suppressed to 5 ppma or lower, is preferred as a gas to be used.

The functions and effects of the method of manufacturing a silicon single crystal substrate in the present embodiment will now be described. According to the method of manufacturing a silicon single crystal substrate in the present embodiment, the silicon single crystal 1 substrate is obtained in which the average density of BMDs in the device formation region 100 which is the surface layer portion of the wafer is lower than $1\times10^8$ /cm$^3$, the average density of BMDs in a central region 200 in the direction of thickness is not lower than approximately $1\times10^8$ /cm$^3$ and not higher than $1\times10^9$ /cm$^3$, resistivity in the center of first main surface 101 is not lower than 50 Ω.cm, and the rate of change in resistivity in the first main surface 101 is not higher than 3%.

In addition, as the silicon single crystal 1 substrate above is subjected to annealing treatment, BMD density in the device formation region 100 can be lowered.

Figure 9:
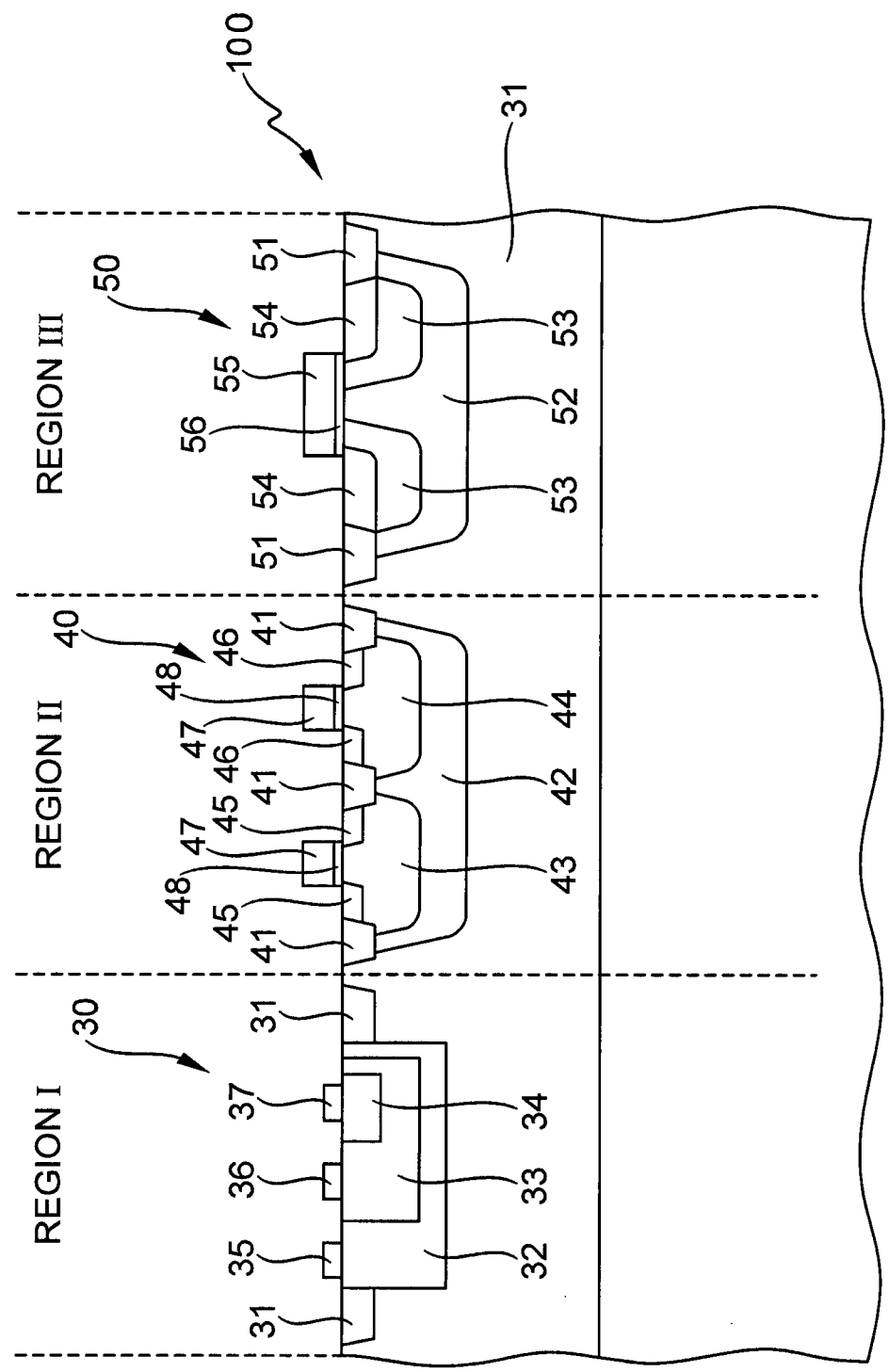
FIG. 9 is a schematic diagram showing a BCD device according to a second embodiment of the invention.

A BCD device according to the present embodiment will be described with reference to FIG. 9.

In fabricating a BCD device according to the present embodiment, a silicon single crystal substrate 10 having characteristics described in the first embodiment is employed. As shown in FIG. 9, the BCD device mainly has a region I, a region II, and a region III in device formation region 100. A bipolar transistor 30 is formed in region I. Bipolar transistor 30 has, for example, a collector region 32, a base region 33, an emitter region 34, a collector electrode 35, a base electrode 36, an emitter electrode 37, and an element isolation film 31. A CMOS 40 is formed in region II. CMOS 40 has, for example, an N well region 42, a P well region 43, an N well region 44, an N region 45, a P region 46, a gate electrode 47, a gate insulating film 48, and an element isolation film 41. A DMOS 50 is formed in region III. DMOS 50 has, for example, an N well region 52, a P region 53, an N region 54, a gate electrode 55, a gate insulating film 56, and an element isolation film 51.

As described above, a power semiconductor manufactured in the BCD process is used for applications where breakdown voltages are intermediate, i.e., up to 200 V. Silicon single crystal substrate 10 has a resistivity around 100 Ωcm at the highest and extension of a depletion layer in this case is 50 μm at the maximum. If a BMD is present in the depletion layer, a leakage current at a pn junction at the time of application of a reverse bias voltage increases. Therefore, BMDs in a region lying between the surface of the substrate and a plane at 50 μm from the surface of the substrate (device formation region 100) should be decreased.

The average density of BMDs in the device formation region 100 of silicon single crystal substrate 10 in the present first embodiment is lower than $1\times10^8$ /cm$^3$. In addition, the average density of BMDs in central region 200 in the direction of thickness of the silicon single crystal substrate 10 (a region lying between a plane at a depth of 300 μm and a plane at a depth of 400 μm from first main surface 101 toward second main surface 102) is not lower than approximately $1\times10^8$ /cm$^3$ and not higher than $1\times10^9$ /cm$^3$. Therefore, the BCD device in the present second embodiment where such a substrate is employed can achieve a reduced current at a pn junction in device formation region 100. In addition, since moderate BMDs are present in the thickness center region 200, heavy metals can also be gettered.

EXAMPLES

Present Inventive Examples and Comparative Examples of the method of manufacturing silicon single crystal according to the embodiment of the present invention will be described.

An apparatus 300 for manufacturing silicon single crystals by the CZ method was used to grow silicon single crystals (ingots) having a diameter of 200 mm. Here, the initial silicon melt had the boron concentrations and phosphorus concentrations shown below, and a seed crystal was immersed in the initial silicon melt to grow the silicon single crystal. A rate of growing crystal was set to 0.9 mm/minute and a rate of cooling a crystal edge portion was set to 1.9 times as high as the rate of cooling the crystal central portion. In order to manufacture silicon single crystals according to Present Inventive Examples 1 to 5 and Comparative Examples 1 to 3, concentrations of boron and phosphorus to be added to the initial silicon melt were set as follows.

Inventive Example 1

Boron and phosphorus were added to the initial silicon melt, such that the boron concentration was $1.6 \times 10^{14}$ atoms/$cm^3$ and the phosphorus concentration was $7.2 \times 10^{13}$ atoms/$cm^3$ (the ratio of phosphorus concentration to boron concentration was 0.45).

Inventive Example 2

Boron and phosphorus were added to the initial silicon melt, such that the boron concentration was $4.0 \times 10^{14}$ atoms/$cm^3$ and the phosphorus concentration was $1.8 \times 10^{14}$ atoms/$cm^3$ (the ratio of phosphorus concentration to boron concentration was 0.45).

Inventive Example 3

Boron and phosphorus were added to the initial silicon melt, such that the boron concentration was attained $1.1 \times 10^{14}$ atoms/$cm^3$ and the phosphorus concentration was $4.6 \times 10^{13}$ atoms/$cm^3$ (the ratio of phosphorus concentration to boron concentration was 0.42).

Inventive Example 4

Boron and phosphorus were added to the initial silicon melt, such that the boron concentration was $1.6 \times 10^{14}$ atoms/$cm^3$ and the phosphorus concentration was $7.5 \times 10^{13}$ atoms/$cm^3$ (the ratio of phosphorus concentration to boron concentration was 0.47).

Inventive Example 5

Boron and phosphorus were added to the initial silicon melt, such that the boron concentration was $1.6 \times 10^{14}$ atoms/$cm^3$ and the phosphorus concentration was $8.0 \times 10^{13}$ atoms/$cm^3$ (the ratio of phosphorus concentration to boron concentration was 0.50).

Comparative Example 1

Boron was added to the initial silicon melt such that the boron concentration was $1.0 \times 10^{14}$ atoms/$cm^3$.

Comparative Example 2

Boron and phosphorus were added to the initial silicon melt, such that the boron concentration was $1.4 \times 10^{14}$ atoms/$cm^3$ and the phosphorus concentration was $4.2 \times 10^{13}$ atoms/$cm^3$ (the ratio of phosphorus concentration to boron concentration was 0.30).

Comparative Example 3

Boron and phosphorus were added to the initial silicon melt, such that the boron concentration was $1.8 \times 10^{14}$ atoms/$cm^3$ and the phosphorus concentration was $9.9 \times 10^{13}$ atoms/$cm^3$ (the ratio of phosphorus concentration to boron concentration was 0.55).

The grown silicon single crystals were cut perpendicularly to the central axis of growth into slices, to thereby form sliced wafers. Thereafter, the sliced wafers were taken from a plurality of positions along the direction of the central axis of growth, and then mirror finished. The wafers thus fabricated were subjected to high-temperature treatment at 1200° C. for 1 hour in an argon gas atmosphere.

Resistivity at each of the center, a point at a radius of 50 mm and a point at a radius of 90 mm of the wafers was measured with a four point probe method. The results of measurements of resistivity at the central point of each wafer were substituted into Equation 3, to thereby calculate a rate of change in resistivity along the central axis of growth of the silicon single crystal. In addition, results of measurement of resistivity at each of the center, the point at a radius of 50 mm and the point at a radius of 90 mm of each silicon wafer were substituted into Equation 3, to thereby similarly calculate a radial rate of change in resistivity in the silicon wafer.

Results in Inventive Example 1 will be described with reference to Table 1.

Table 1 shows resistivity at the wafer center and a radial rate of change in resistivity in the wafer with respect to a solidified fraction at a position where the wafer was produced according to Present Inventive Example 1.

TABLE 1

| Solidified Fraction | Resistivity at Wafer Center [Ω · cm] | Radial Rate of Change in Resistivity [%] |
|---|---|---|
| 0.07 | 140 | 1.3 |
| 0.29 | 136 | 0.6 |
| 0.51 | 131 | 0.4 |
| 0.55 | 130 | 1.4 |
| 0.58 | 130 | 1.2 |
| 0.61 | 130 | 0.9 |
| 0.64 | 130 | 1.2 |
| 0.67 | 130 | 0.6 |
| 0.71 | 130 | 0.5 |
| 0.73 | 132 | 1.0 |
| 0.80 | 138 | 0.8 |

According to Table 1, at a site where the solidified fraction was not higher than 0.80, a minimum value of resistivity along the central axis of growth of silicon single crystal (corresponding to resistivity at the wafer center) was 130 Ω·cm, the rate of change in resistivity along the central axis of growth was 7.1%, and a maximum value of the rate of change in resistivity in the cross-section perpendicular to the central axis of growth was 1.4%. Thus, a silicon single crystal, in which the resistivity along the central axis of growth of silicon single crystal was not lower than 50 Ω·cm, the rate of change in resistivity along the central axis of growth was not higher than 10%, and the rate of change in resistivity in the cross-section perpendicular to the central axis of growth was not higher than 3%, was obtained.

It is noted that the radial rate of change in resistivity at a site where the solidified fraction exceeded 0.80 in the silicon single crystal obtained in the Inventive Example exceeded 3%.

Results in Comparative Example 1 will be described with reference to Table 2. Table 2 shows results of resistivity at the silicon wafer center and a radial rate of change in resistivity in a silicon wafer with respect to a solidified fraction at a position where the silicon wafer was produced according to Comparative Example 1.

TABLE 2

| Solidified Fraction | Resistivity at Wafer Center [Ω · cm] | Radial Rate of Change in Resistivity [%] |
|---|---|---|
| 0.04 | 162 | 4.0 |
| 0.17 | 156 | 3.5 |
| 0.33 | 148 | 3.7 |
| 0.46 | 143 | 2.0 |
| 0.62 | 131 | 3.2 |
| 0.72 | 122 | 2.8 |
| 0.80 | 114 | 3.4 |

According to Table 2, at a site where the solidified fraction was not higher than 0.80, a minimum value of resistivity along the central axis of growth of silicon single crystal (corresponding to resistivity at the wafer center) was not lower than 114 Ω·cm, the rate of change in resistivity along the central axis of growth was 29.6%, and a maximum value of the rate of change in resistivity in the cross-section perpendicular to the central axis of growth was 4.0%. Thus, manufacture of a silicon single crystal, in which resistivity along the central axis of growth of silicon single crystal was not lower than 50 Ω·cm, the rate of change in resistivity along the central axis of growth was not higher than 10%, and the rate of change in resistivity in the cross-section perpendicular to the central axis of growth was not higher than 3%, could not be realized.

Results in Present Inventive Examples 1 to 5 and Comparative Examples 1 to 3 will be described with reference to Table 3. Table 3 shows results of resistivity at the wafer center in the silicon single crystal manufactured according to each Inventive Example and each Comparative Example, the rate of change in resistivity along the central axis of growth, and the rate of change in resistivity in the cross-section perpendicular to the central axis of growth, together with each impurity concentration in the initial silicon melt.

specifications required to satisfy specifications of silicon wafers for power devices, where resistivity along the central axis of growth was not lower than 50 Ω·cm, the rate of change in resistivity along the central axis of growth was not higher than 10%, and the rate of change in resistivity in the cross-section perpendicular to the central axis of growth was not higher than 3%.

In addition, in Inventive Examples 1 to 4, at sites where the solidified fraction was not higher than 0.80, a maximum value of the rate of change in resistivity in the cross-section perpendicular to the central axis of growth was not higher than 2%.

On the other hand, in Comparative Examples 1 to 3, at sites where the solidified fraction was not higher than 0.80, a minimum value of resistivity along the central axis of growth of silicon single crystal ranged from 114 to 124 Ω·cm, the rate of change in resistivity along the central axis of growth ranged from 7.3 to 29.8%, and a maximum value of the rate of change in resistivity in the cross-section perpendicular to the central axis of growth ranged from 3.3 to 4.0%. Thus, the silicon single crystals obtained in the Comparative Examples could not satisfy specifications of silicon single crystals required to satisfy specifications for power device applications, with regard to the rate of change in resistivity along the central axis of growth and the rate of change in resistivity in the cross-section perpendicular to the central axis of growth.

Attention being paid to the relationship between the rate of change in resistivity along the central axis of growth and the radial rate of change in resistivity of silicon single crystals of Inventive Examples 1 to 4 and Comparative Examples 1 to 3, there is a tendency that the radial rate of change in resistivity is greater as the rate of change in resistivity along the central axis of growth is greater.

According to the measurement results in Inventive Examples described above, it was demonstrated that, with the method of the present embodiment, that is, by setting the

TABLE 3

| | Impurity Concentration in Initial Silicon Melt | | | Resistivity at Wafer Center [Ω · cm] | | Rate of Change in Resistivity Along | Rate of Change in Resistivity in |
|---|---|---|---|---|---|---|---|
| | [atoms/cm$^3$] | | | Maximum | Minimum | Central Axis of | Perpendicular Cross- |
| | B | P | P/B Ratio | Value | Value | Growth [%] | Section [%] |
| Inventive Example 1 | $1.6 \times 10^{14}$ | $7.2 \times 10^{13}$ | 0.45 | 140 | 130 | 7.1 | 1.4 |
| Inventive Example 2 | $4.0 \times 10^{14}$ | $1.8 \times 10^{14}$ | 0.45 | 54 | 50 | 7.4 | 1.7 |
| Inventive Example 3 | $1.1 \times 10^{14}$ | $4.6 \times 10^{13}$ | 0.42 | 192 | 175 | 8.9 | 1.5 |
| Inventive Example 4 | $1.6 \times 10^{14}$ | $7.5 \times 10^{13}$ | 0.47 | 136 | 128 | 6.1 | 1.6 |
| Inventive Example 5 | $1.6 \times 10^{14}$ | $8.0 \times 10^{13}$ | 0.50 | 139 | 132 | 4.7 | 2.5 |
| Comparative Example 1 | $1.0 \times 10^{14}$ | 0 | 0.00 | 163 | 114 | 29.8 | 4.0 |
| Comparative Example 2 | $1.4 \times 10^{14}$ | $4.2 \times 10^{13}$ | 0.30 | 140 | 117 | 16.9 | 3.4 |
| Comparative Example 3 | $1.8 \times 10^{14}$ | $9.9 \times 10^{13}$ | 0.55 | 134 | 124 | 7.3 | 3.3 |

According to Table 3, in Inventive Examples 1 to 5, at a site where the solidified fraction was not higher than 0.80, a minimum value of resistivity along the central axis of growth of silicon single crystal ranged from 50 to 175 Ω·cm, the rate of change in resistivity along the central axis of growth ranged from 4.7 to 8.9%, and a maximum value of the rate of change in resistivity in the cross-section perpendicular to the central axis of growth ranged from 1.4 to 2.5%. Thus, the silicon single crystals obtained in each Inventive Example meet the boron concentration in the initial silicon melt to $4 \times 10^{14}$ atoms/cm$^3$ or lower and setting a ratio of phosphorus concentration to boron concentration to 0.42 or higher and 0.50 or lower, p-type silicon single crystals, in which, at sites where the solidified fraction was not higher than 0.80, resistivity along the central axis of growth was not lower than 50 Ω·cm, the rate of change in resistivity at the central axis of growth was not higher than 10%, and the rate of change in resistivity in the cross-section perpendicular to the central axis of growth was not higher than 3%, could be manufactured.

In addition, it was demonstrated that, by setting the boron concentration in the initial silicon melt to $4 \times 10^{14}$ atoms/cm$^3$ or lower and setting a ratio of phosphorus concentration to boron concentration to 0.42 or higher and 0.47 or lower, p-type silicon single crystals, in which, at sites where the solidified fraction was not higher than 0.80, resistivity along the central axis of growth was not lower than 50 Ω·cm, the rate of change in resistivity along the central axis of growth was not higher than 10%, and the rate of change in resistivity in the cross-section perpendicular to the central axis of growth was not higher than 2%, could be manufactured.

FURTHER EXAMPLES

Inventive Examples and Comparative Examples of the method of manufacturing silicon single crystal according to the embodiment of the present invention will be described.

Silicon single crystal wafers according to Inventive Examples 6 to 11 and Comparative Examples 4 to 8 were manufactured as follows. Initially, an initial silicon melt to which phosphorus and boron had been added under the conditions described in Inventive Example 1 was prepared. Nitrogen was added to the initial silicon melt. The method of adding nitrogen was as described in the first embodiment. Silicon single crystals were grown under conditions such that the rate of cooling of the central portion of silicon single crystal from 1200° C. to 1100° C. was not less than 6° C./minute and the silicon single crystals had oxygen concentrations of not lower than $5.0 \times 10^{17}$ atoms/cm$^3$ and not higher than $7.0 \times 10^{17}$ atoms/cm$^3$ and had nitrogen concentrations not lower than $2.0 \times 10^{13}$ atoms/cm$^3$ and not higher than $4.0 \times 10^{14}$ atoms/cm$^3$. The rate of change in resistivity in a direction of the axis of crystal growth was not higher than 10%, and the rate of change in resistivity in a cross-section perpendicular to the central axis was not higher than 3%. A silicon single crystal wafer was fabricated by slicing the silicon single crystal along a plane perpendicular to the axis of growth.

The silicon single crystal wafers were subjected to heat treatment below, as a BCD device simulation heat treatment. In a first step, heat treatment at a temperature of 1000° C. was performed in an oxygen atmosphere for 12 minutes. In a second step, heat treatment at a temperature of 1200° C. was performed in an argon atmosphere for 240 minutes. The second step was repeated three times. In a third step, heat treatment at a temperature of 670° C. was performed in a nitrogen atmosphere for 80 minutes. In a fourth step, heat treatment at a temperature of 1100° C. was performed in a water vapor atmosphere for 120 minutes. In a fifth step, heat treatment at a temperature of 630° C. was performed in a nitrogen atmosphere for 100 minutes. In a sixth step, heat treatment at a temperature of 1000° C. was performed in a nitrogen atmosphere for 180 minutes.

In order to manufacture silicon single crystal substrates according to Inventive Examples 6 to 11 and Comparative Examples 4 to 8, the oxygen concentrations and nitrogen concentrations in single crystal silicon and the rate of cooling the central portion of silicon single crystal from 1200° C. to 1100° C. were set as follows.

Inventive Example 6

Oxygen concentration in the single crystal silicon was set to $7.0 \times 10^{17}$ atoms/cm$^3$, nitrogen concentration to $2.2 \times 10^{13}$ atoms/cm$^3$, and the rate of cooling of the central portion of the silicon single crystal from 1200° C. to 1100° C. was set to 8.0° C./minute.

Inventive Example 7

Oxygen concentration in the single crystal silicon was set to $7.0 \times 10^{17}$ atoms/cm$^3$, nitrogen concentration to $1.5 \times 10^{14}$ atoms/cm$^3$, and the rate of cooling of the central portion of the silicon single crystal from 1200° C. to 1100° C. was set to 7.0° C./minute.

Inventive Example 8

Oxygen concentration in the single crystal silicon was set to $6.0 \times 10^{17}$ atoms/cm$^3$, nitrogen concentration to $1.5 \times 10^{14}$ atoms/cm$^3$, and the rate of cooling of the central portion of the silicon single crystal from 1200° C. to 1100° C. was set to 7.0° C./minute.

Inventive Example 9

Oxygen concentration in the single crystal silicon was set to $5.0 \times 10^{17}$ atoms/cm$^3$, nitrogen concentration to $4.0 \times 10^{14}$ atoms/cm$^3$, and the rate of cooling of the central portion of the silicon single crystal from 1200° C. to 1100° C. was set to 6.0° C./minute.

Inventive Example 10

Oxygen concentration in the single crystal silicon was set to $6.0 \times 10^{17}$ atoms/cm$^3$, nitrogen concentration to $2.1 \times 10^{14}$ atoms/cm$^3$, and the rate of cooling the central portion of silicon single crystal from 1200° C. to 1100° C. was set to 7.0° C./minute.

Inventive Example 11

Oxygen concentration in the single crystal silicon was set to $6.0 \times 10^{17}$ atoms/cm$^3$, nitrogen concentration to $1.0 \times 10^{14}$ atoms/cm$^3$, and the rate of cooling of the central portion of the silicon single crystal from 1200° C. to 1100° C. was set to 7.0° C./minute.

Comparative Example 4

Oxygen concentration in the single crystal silicon was set to $6.0 \times 10^{17}$ atoms/cm$^3$, nitrogen concentration to $7.0 \times 10^{14}$ atoms/cm$^3$, and the rate of cooling of the central portion of the silicon single crystal from 1200° C. to 1100° C. was set to 8.0° C./minute.

Comparative Example 5

Oxygen concentration in the single crystal silicon was set to $8.0 \times 10^{17}$ atoms/cm$^3$, nitrogen concentration to $1.0 \times 10^{14}$ atoms/cm$^3$, and the rate of cooling of the central portion of the silicon single crystal from 1200° C. to 1100° C. was set to 8.0° C./minute.

Comparative Example 6

Oxygen concentration in single crystal silicon was set to $7.0 \times 10^{17}$ atoms/cm$^3$, and a rate of cooling the central portion of silicon single crystal from 1200° C. to 1100° C. was set to 8.0° C./minute. No nitrogen was added.

Comparative Example 7

Oxygen concentration in the single crystal silicon was set to $4.5 \times 10^{17}$ atoms/cm$^3$, nitrogen concentration to $1.0 \times 10^{14}$ atoms/cm$^3$, and the rate of cooling of the central portion of the silicon single crystal from 1200° C. to 1100° C. was set to 8.0° C./minute.

Comparative Example 8

Oxygen concentration in the single crystal silicon was set to $6.0 \times 10^{17}$ atoms/cm$^3$, nitrogen concentration to $1.0 \times 10^{14}$ atoms/cm$^3$, and the rate of cooling of the central portion of the silicon single crystal from 1200° C. to 1100° C. was set to 5.0° C./minute.

Inventive Examples 6 to 11 satisfy conditions such that the rate of cooling of the central portion of the silicon single crystals from 1200° C. to 1100° C. was not less than 6° C./minute, the silicon single crystals had oxygen concentrations not lower than $5.0 \times 10^{17}$ atoms/cm$^3$ and not higher than $7.0 \times 10^{17}$ atoms/cm$^3$, and nitrogen concentrations not lower than $2.0 \times 10^{13}$ atoms/cm$^3$ and not higher than $4.0 \times 10^{14}$ atoms/cm$^3$.

Comparative Examples 4 to 8 do not satisfy the conditions above. In addition, in Inventive Examples 10 and 11 and Comparative Examples 4 to 8, annealing in an argon atmosphere was carried out. In the annealing step, the silicon single crystal substrates were subjected to heat treatment at a temperature not lower than 1200° C. for a period not less than 1 hour and not longer than 8 hours.

A method of measuring average BMD density will now be described.

BMDs in a silicon wafer were measured with a BMD Analyzer MO-4 manufactured by Raytex Corporation, by cleaving a silicon wafer. By allowing laser in parallel to a wafer surface to be incident on a cleavage plane, scattered light that came out of the wafer surface was detected. A position of a measurement point in a plane was set at a wafer center. Laser was allowed to be incident on a position at a depth of 10 µm, 20 µm, 30 µm, 40 µm, and 50 µm from the wafer surface and BMD density at each depth was found. An average value of BMD densities was adopted as the average density of BMDs in a region extending as great as a depth of 50 µm from the wafer surface.

In addition, laser was allowed to be incident on positions at 10-µm intervals, in a portion at a depth from 300 µm to 400 µm from the wafer surface and BMD density at each depth was found. An average value of BMD densities was adopted as the average density of BMDs in a region at 300 to 400 µm from the wafer surface. It is noted that the lower limit value of BMD density with the present measurement method is $5 \times 10^6$ cm$^3$. Average density of BMDs lower than the lower limit value was indicated with "–".

Results in the present example will be described with reference to Table 4.

TABLE 4

| | Oxygen Concentration [atoms/cm$^3$] | Nitrogen Concentration in Melt [atoms/cm$^3$] | Solidified Fraction | Nitrogen Concentration [atoms/cm$^3$] | Rate of Cooling Central Portion of Silicon Single Crystal from 1200 to 1100° C. [° C./min] | Ar Annealing | Average Density of BMDs in Region at 300 to 400 µm from Wafer Surface [/cm$^3$] | Average Density of BMDs in Region Extending as far as Depth of 50 µm from Wafer Surface [/cm$^3$] |
|---|---|---|---|---|---|---|---|---|
| Inventive Example 6 | $7.0 \times 10^{17}$ | $3.0 \times 10^{16}$ | 0.04 | $2.2 \times 10^{13}$ | 8.0 | Not Performed | $5.4 \times 10^8$ | $7.3 \times 10^7$ |
| Inventive Example 7 | $7.0 \times 10^{17}$ | $2.1 \times 10^{17}$ | 0.04 | $1.5 \times 10^{14}$ | 7.0 | Not Performed | $4.2 \times 10^8$ | $6.5 \times 10^7$ |
| Inventive Example 8 | $6.0 \times 10^{17}$ | $1.1 \times 10^{17}$ | 0.50 | $1.5 \times 10^{14}$ | 7.0 | Not Performed | $3.2 \times 10^8$ | $4.9 \times 10^7$ |
| Inventive Example 9 | $5.0 \times 10^{17}$ | $1.1 \times 10^{17}$ | 0.80 | $4.0 \times 10^{14}$ | 6.0 | Not Performed | $9.1 \times 10^8$ | $2.0 \times 10^7$ |
| Inventive Example 10 | $6.0 \times 10^{17}$ | $1.5 \times 10^{17}$ | 0.50 | $2.1 \times 10^{14}$ | 7.0 | 1200° C., 1 hour | $3.1 \times 10^8$ | $7.3 \times 10^6$ |
| Inventive Example 11 | $6.0 \times 10^{17}$ | $1.4 \times 10^{17}$ | 0.04 | $1.0 \times 10^{14}$ | 7.0 | 1200° C., 8 hours | $3.4 \times 10^8$ | $5.5 \times 10^6$ |
| Comparative Example 4 | $6.0 \times 10^{17}$ | $2.0 \times 10^{17}$ | 0.80 | $7.0 \times 10^{14}$ | 8.0 | 1200° C., 1 hour | $3.4 \times 10^8$ | $2.3 \times 10^8$ |
| Comparative Example 5 | $8.0 \times 10^{17}$ | $1.4 \times 10^{17}$ | 0.04 | $1.0 \times 10^{14}$ | 8.0 | 1200° C., 1 hour | $2.5 \times 10^9$ | $3.0 \times 10^8$ |
| Comparative Example 6 | $7.0 \times 10^{17}$ | Not Added | — | Not Added | 8.0 | 1200° C., 1 hour | $4.8 \times 10^8$ | $1.5 \times 10^8$ |
| Comparative Example 7 | $4.5 \times 10^{17}$ | $1.4 \times 10^{17}$ | 0.04 | $1.0 \times 10^{14}$ | 8.0 | 1200° C., 1 hour | — | — |
| Comparative Example 8 | $6.0 \times 10^{17}$ | $1.4 \times 10^{17}$ | 0.04 | $1.0 \times 10^{14}$ | 5.0 | 1200° C., 1 hour | $3.2 \times 10^8$ | $4.0 \times 10^8$ |

As shown in Table 4, the average density of BMDs in the region lying between the plane at 300 µm from the wafer surface and the plane at 400 µm from the wafer surface of the silicon single crystal substrate of Inventive Examples 6 to 11 was not lower than $3.1 \times 10^8$ /cm$^3$ and not higher than $9.1 \times 10^8$ /cm$^3$. In addition, the average density of BMDs in the region lying between the wafer surface and the plane at 50 µm from the wafer surface of the silicon single crystal substrate according to Inventive Examples 6 to 11 was not lower than $5.5 \times 10^6$ /cm$^3$ and not higher than $7.3 \times 10^7$ /cm$^3$. On the other hand, the average density of BMDs in the region extending as far as the plane at 50 µm from the wafer surface of the silicon single crystal substrates of Comparative Examples 4 to 8 indicated a high value not lower than $1.5 \times 10^8$ /cm$^3$.

Further, the average density of BMDs in the region extending as far as the plane at 50 µm from the wafer surface of the silicon single crystal substrates of Inventive Examples 10 to 11 subjected to annealing treatment for 1 hour or 8 hours at a temperature not lower than 1200° C. in an argon atmosphere was not lower than $5.5\times10^6$ /cm$^3$ and not higher than $7.3\times10^6$ /cm$^3$, which was lower than BMD densities in Inventive Examples 6 to 9 which were not subjected to the annealing treatment.

Based on the results above, it was demonstrated that, in a silicon single crystal substrates manufactured by slicing silicon single crystal prepared with a rate of cooling of the central portion of the silicon single crystal from 1200° C. to 1100° C. of not less than 6° C./minute, with an oxygen concentration not lower than $5.0\times10^{17}$ atoms/cm$^3$ and not higher than $7.0\times10^{17}$ atoms/cm$^3$ and a nitrogen concentration not lower than $2.0\times10^{13}$ atoms/cm$^3$ and not higher than $4.0\times10^{14}$ atoms/cm$^3$, the average density of BMDs in the region lying between the wafer surface and a plane at 50 μm from the wafer surface was lower than $1\times10^8$ /cm$^3$ and the average density of BMDs in the region lying between a plane at 300 μm from the wafer surface and a plane at 400 μm from the wafer surface was not lower than $1\times10^8$ /cm$^3$ and not higher than $1\times10^9$ /cm$^3$.

Furthermore, it was demonstrated that the average density of BMDs in the region lying between the wafer surface and a plane at 50 μm from the wafer surface could be lowered further by subjecting the silicon single crystal substrate to annealing treatment for a period of not less than 1 hour and not longer than 8 hours at a temperature not lower than 1200° C. in an argon atmosphere.

It should be understood that the embodiments and the examples disclosed herein are illustrative and non-restrictive in every respect. The scope of the present invention is defined by the terms of the claims, rather than the embodiments and the examples above, and is intended to include any modifications within the scope and meaning equivalent to the terms of the claims.

What is claimed is:

1. A method of manufacturing a silicon single crystal substrate, comprising the steps of:
    preparing an initial silicon melt having a boron concentration and a phosphorous concentration, said boron concentration being not higher than $4\times10^{14}$ atoms/cm$^3$ and a ratio of phosphorus concentration to boron concentration being not lower than 0.42 and not higher than 0.50;
    growing a silicon single crystal by the Czochralski method from said initial silicon melt; and
    slicing said silicon single crystal to form a silicon single crystal substrate;
    wherein in said step of growing said silicon single crystal, said silicon single crystal is grown under conditions such that a ratio of the rate of cooling of an edge portion of the silicon single crystal to a rate of cooling a central portion of the silicon single crystal from the melting point of silicon to 1350° C. is not lower than 1.4 and not higher than 2.0, and the rate of cooling the central portion from 1200° C. to 1100° C. is not less than 6° C./minute, said silicon single crystal having an oxygen concentration not lower than $5.0\times10^{17}$ atoms/cm$^3$ and not higher than $7.0\times10^{17}$ atoms/cm$^3$ and a nitrogen concentration not lower than $2.0\times10^{13}$ atoms/cm$^3$ and not higher than $4.0\times10^{14}$ atoms/cm$^3$.

2. The method of claim 1, further comprising a step of annealing the silicon single crystal substrate by
    heat treatment at a temperature not lower than 1200° C. and not higher than 1250° C. for a period not less than 1 hour and not longer than 8 hours in a noble gas atmosphere in which the concentration of impurities is not higher than 0.5% by volume, or in a non-oxidizing atmosphere.

3. The method of claim 1, wherein a pull rate of the crystal during the step of growing is from 0.9 mm/min to 1.9 mm/min.

4. The method of claim 1, wherein the oxygen concentration is in the range of $5.0\times10^{17}$ atoms/cm$^3$ to $6.0\times10^{17}$ atoms/cm$^3$.

5. The method of claim 1, wherein the nitrogen concentration is in the range of $1.0\times10^{14}$ atoms/cm$^3$ to $4.0\times10^{14}$ atoms/cm$^3$.

6. The method of claim 4, wherein the nitrogen concentration is in the range of $1.0\times10^{14}$ atoms/cm$^3$ to $4.0\times10^{14}$ atoms/cm$^3$.

7. The method of claim 1, wherein the height difference between position of the melt interface at the axial center of the crystal and the position of the melt interface at the radial edge of the crystal during growing is between 5 mm and 15 mm.

8. The method of claim 1, wherein a wafer substrate sliced from the silicon single crystal substrate has a first main surface, and a second main surface opposite said first main surface, has a resistivity in the center of the first main surface of not less than 50 Ω·cm, a rate of change in resistivity from the center of the first main surface to its edge of not more than 3%, an average density of oxygen precipitate BMDs in a device forming region bounded by the surface of the first main surface and a plane 50 μm below this surface lower than $1\times10^8$/cm$^3$, and an average density of oxygen precipitate BMDs in a region bounded by a first plane at a depth of 300 μm from the first main surface and a second plane at a depth of 400 μm from the first main surface in the range of $1\times10^8$/cm$^3$ to $1\times10^9$/cm$^3$.

9. The method of claim 1, wherein the resistivity in the center of a wafer sliced from the silicon single crystal is $\geq 50$ Ω·cm.

* * * * *